United States Patent
Brogle et al.

(10) Patent No.: US 12,015,051 B2
(45) Date of Patent: Jun. 18, 2024

(54) SEMICONDUCTOR DEVICE AND METHOD OF FORMING MONOLITHIC SURGE PROTECTION RESISTOR

(71) Applicant: MACOM Technology Solutions Holdings, Inc., Lowell, MA (US)

(72) Inventors: James J. Brogle, Merrimac, MA (US); Timothy E. Boles, Tyngsboro, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 260 days.

(21) Appl. No.: 17/449,600

(22) Filed: Sep. 30, 2021

(65) Prior Publication Data
US 2023/0099042 A1  Mar. 30, 2023

(51) Int. Cl.
*H01L 29/94* (2006.01)
*H01L 29/66* (2006.01)
*H01L 49/02* (2006.01)

(52) U.S. Cl.
CPC ............. *H01L 28/91* (2013.01); *H01L 28/92* (2013.01); *H01L 29/66181* (2013.01); *H01L 29/945* (2013.01)

(58) Field of Classification Search
CPC ......... H01L 28/90–92; H01L 29/66181; H01L 29/945
See application file for complete search history.

(56) References Cited

U.S. PATENT DOCUMENTS

| | | | |
|---|---|---|---|
| 9,178,080 B2 * | 11/2015 | Kalnitsky | ............. H01L 29/945 |
| 2004/0099898 A1 * | 5/2004 | Grivna | ................... H01L 29/945 257/532 |
| 2006/0202249 A1 | 9/2006 | Cheng et al. | |
| 2012/0080771 A1 | 4/2012 | Yang et al. | |
| 2018/0076338 A1 | 3/2018 | Nishiwaki | |

FOREIGN PATENT DOCUMENTS

| | | |
|---|---|---|
| JP | S63114158 A | 5/1988 |
| JP | H0232564 A | 2/1990 |

* cited by examiner

*Primary Examiner* — Jose R Diaz
(74) *Attorney, Agent, or Firm* — Robert D. Atkins; PATENT LAW GROUP: Atkins and Associates, P.C.

(57) ABSTRACT

A semiconductor device has a substrate and a first semiconductor layer with a high resistivity, such as an epitaxial layer with a resistivity in the range of 3000-5000 ohms/cm$^2$, formed over the substrate. A second semiconductor layer is formed at least partially in the first semiconductor layer. A capacitor is formed at least partially over the first semiconductor layer. The capacitor has a plurality of trenches extending through the first semiconductor layer and into the substrate, and a first insulating layer formed in the trench. The trenches can be parallel, serpentine, or other geometric shape. The capacitor also has a second insulating layer formed over the first insulating layer, and a polysilicon layer formed over the second insulating layer. A conductive layer is formed over the capacitor. The first semiconductor layer with high resistivity provides a vertical path to discharge high voltage events incident on the capacitor.

20 Claims, 14 Drawing Sheets

SEMICONDUCTOR DEVICE AND METHOD OF FORMING MONOLITHIC SURGE PROTECTION RESISTOR

FIELD OF THE INVENTION

The present invention relates in general to semiconductor devices and, more particularly, to a semiconductor device and method of forming a monolithic surge protection resistor for a high voltage capacitor or other semiconductor device.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and oxide semiconductor field effect transistor (MOSFET). Integrated semiconductor devices typically contain hundreds to millions of electrical components. Examples of integrated semiconductor devices include microcontrollers, microprocessors, and various analog and digital circuits.

Semiconductor devices perform a wide range of functions, such as signal processing, high-speed calculations, transmitting and receiving electromagnetic signals, controlling electronic devices, transforming sunlight to electricity, and creating visual projections for television displays. Semiconductor devices are found in the fields of communications, power conversion, networks, computers, and consumer products. Semiconductor devices are also found in military applications, aerospace, aviation, automotive, industrial controllers, and office equipment.

One known semiconductor device is a high voltage capacitor in a monolithic semiconductor package. A high voltage capacitor has a normal operating range in the hundreds or even thousands of volts. The capacitor commonly has a dielectric layer disposed between two conductive terminals. In the event of a surge of high voltage, in excess of the capacitor's rating, leakage currents are induced that can damage the capacitor. The excess leakage current can flow from the high voltage terminal of the capacitor, laterally through the dielectric layer, and out the side of the semiconductor package just below the dielectric layer. A common solution is to add a resistor external to the capacitor semiconductor package to dissipate the excess leakage current. The external resistor adds another device to the limited printed circuit board (PCB) area, and increases manufacturing costs.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
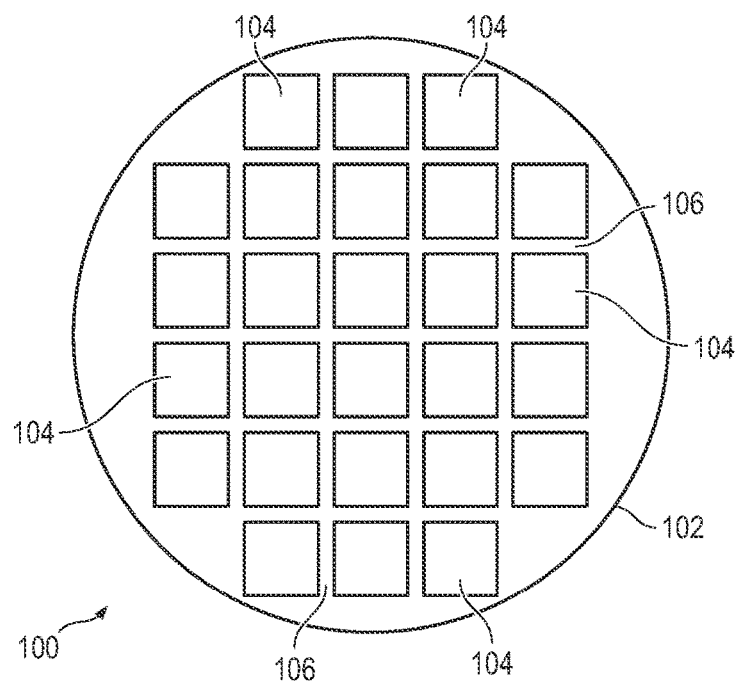
FIGS. 1a-1b illustrate a semiconductor wafer with a plurality of semiconductor die.

FIG. 1a shows semiconductor wafer or substrate 100 with a base substrate material 102, such as silicon (Si), silicon carbide (SiC), germanium, aluminum phosphide, aluminum arsenide, gallium arsenide, gallium nitride, indium phosphide, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-300 millimeters (mm).

Figure 1B:
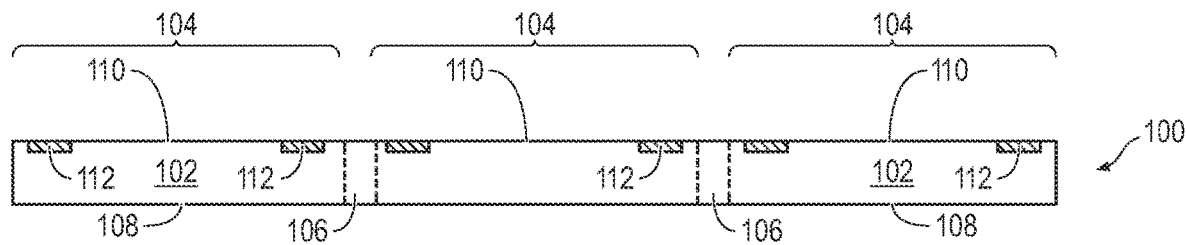

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more high voltage transistors, diodes, capacitors, and other circuit elements formed within active surface 110 to implement or be used with analog circuits or digital circuits. In the present embodiment, semiconductor die 104 contains a monolithic high voltage capacitor, in the range of 200v to 3000v. In another embodiment, semiconductor die 104 contains a monolithic high voltage semiconductor device, such as a diode, transistor, or other circuit or circuit element.

An electrically conductive layer 112 is formed over active surface 110 using physical vapor deposition (PVD), chemical vapor deposition (CVD), plasma enhanced chemical vapor deposition (PECVD), low pressure chemical vapor deposition (LPCVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 2A:
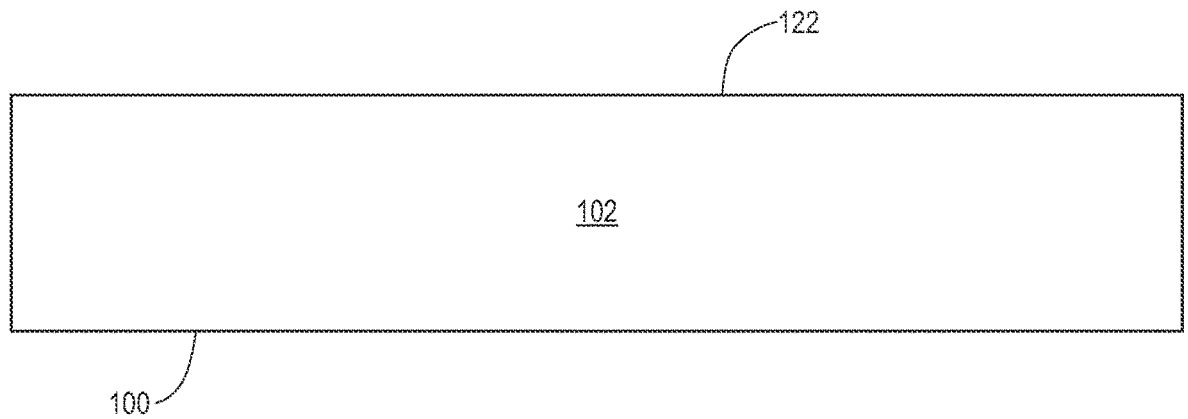
FIGS. 2a-2o illustrate a process of forming a monolithic surge protection resistor for a high voltage capacitor with a plurality of trenches.
Figure 2B:
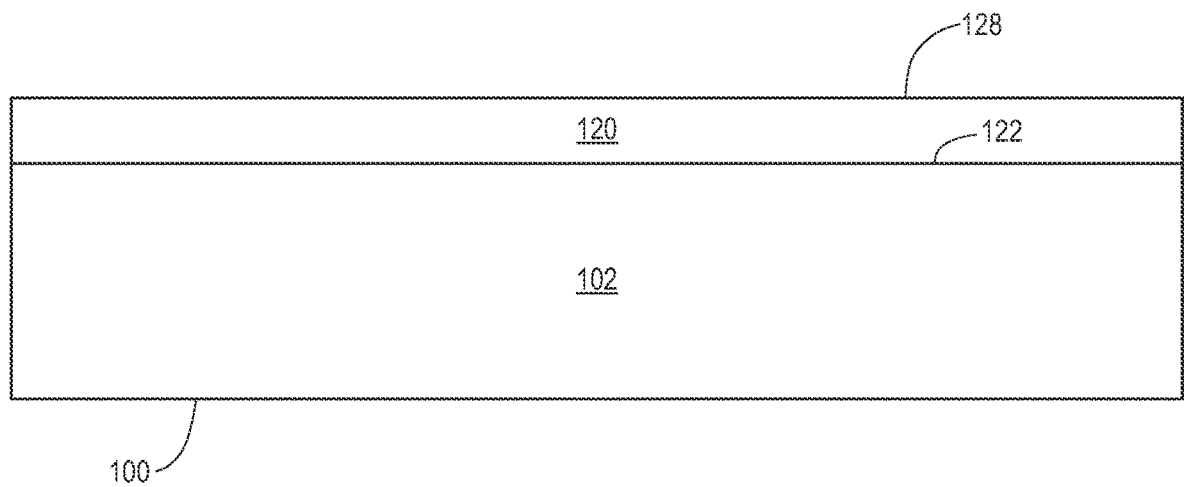
Figure 2C:
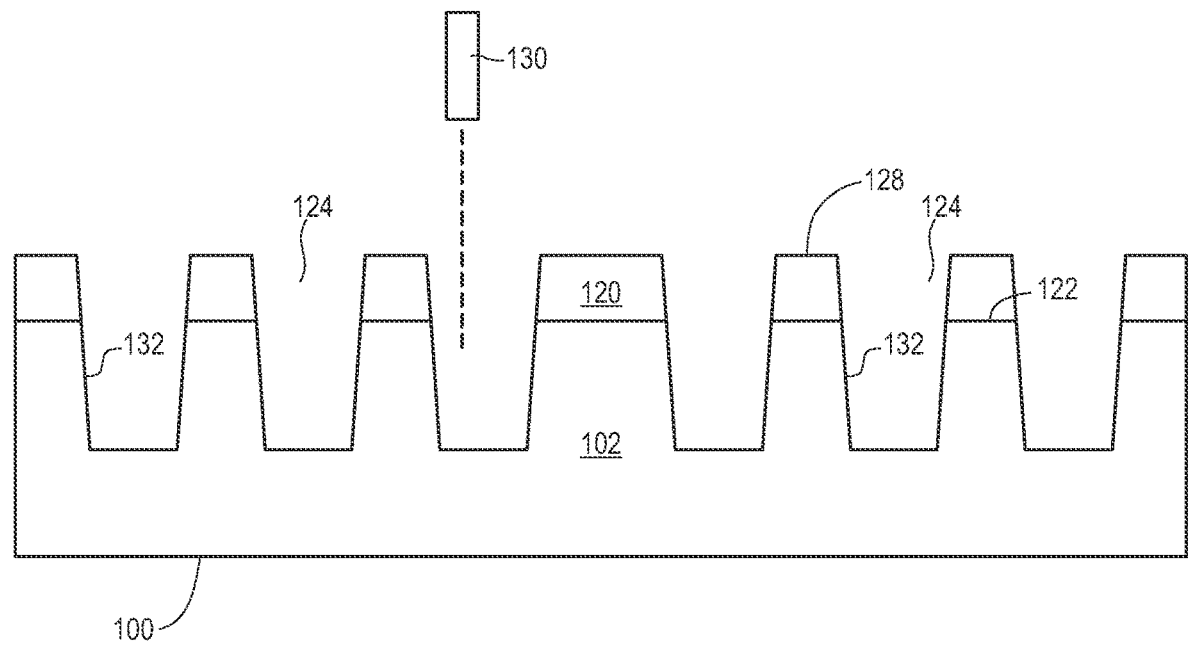
Figure 2D:
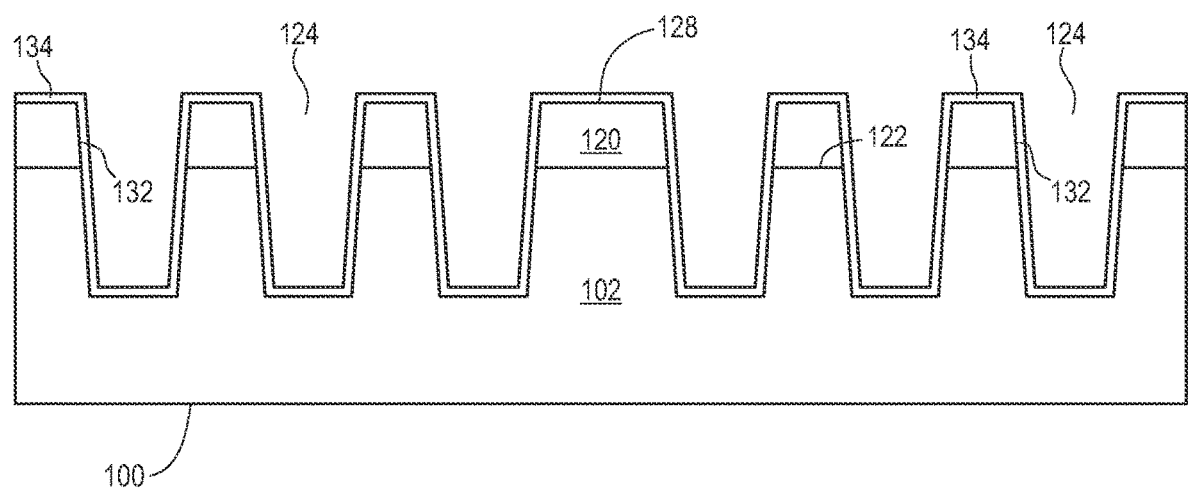
Figure 2E:
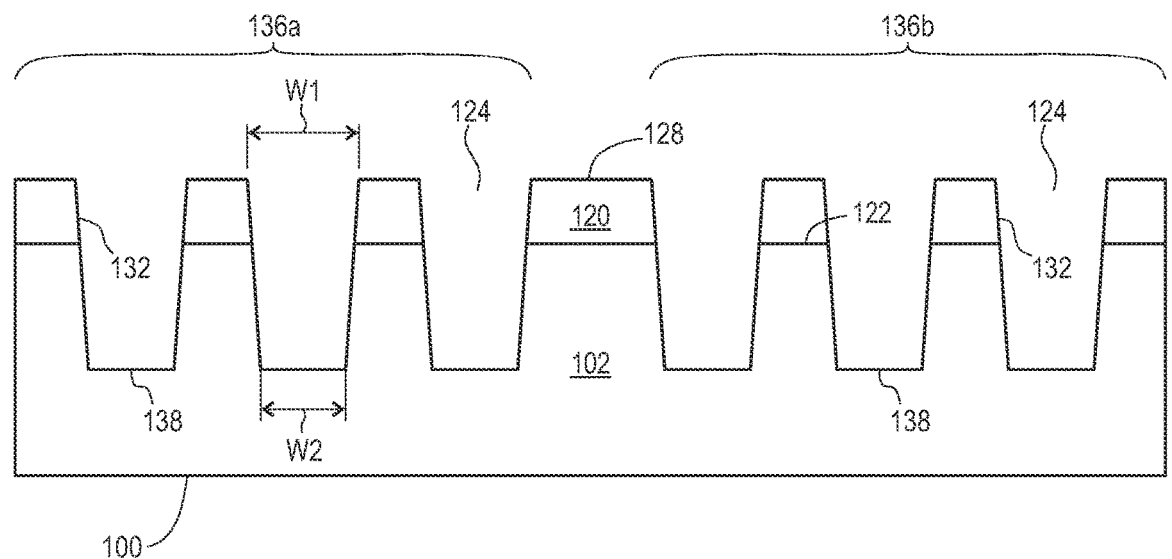
Figure 2F:
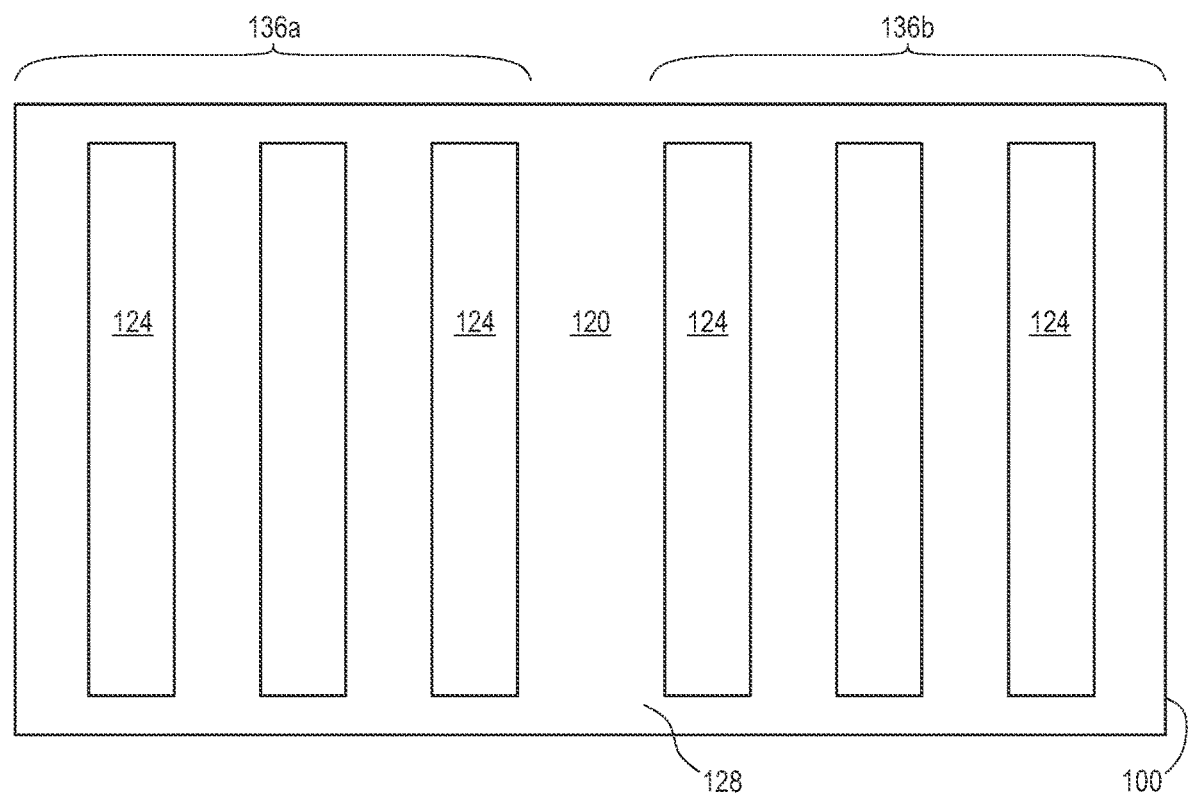
Figure 2G:
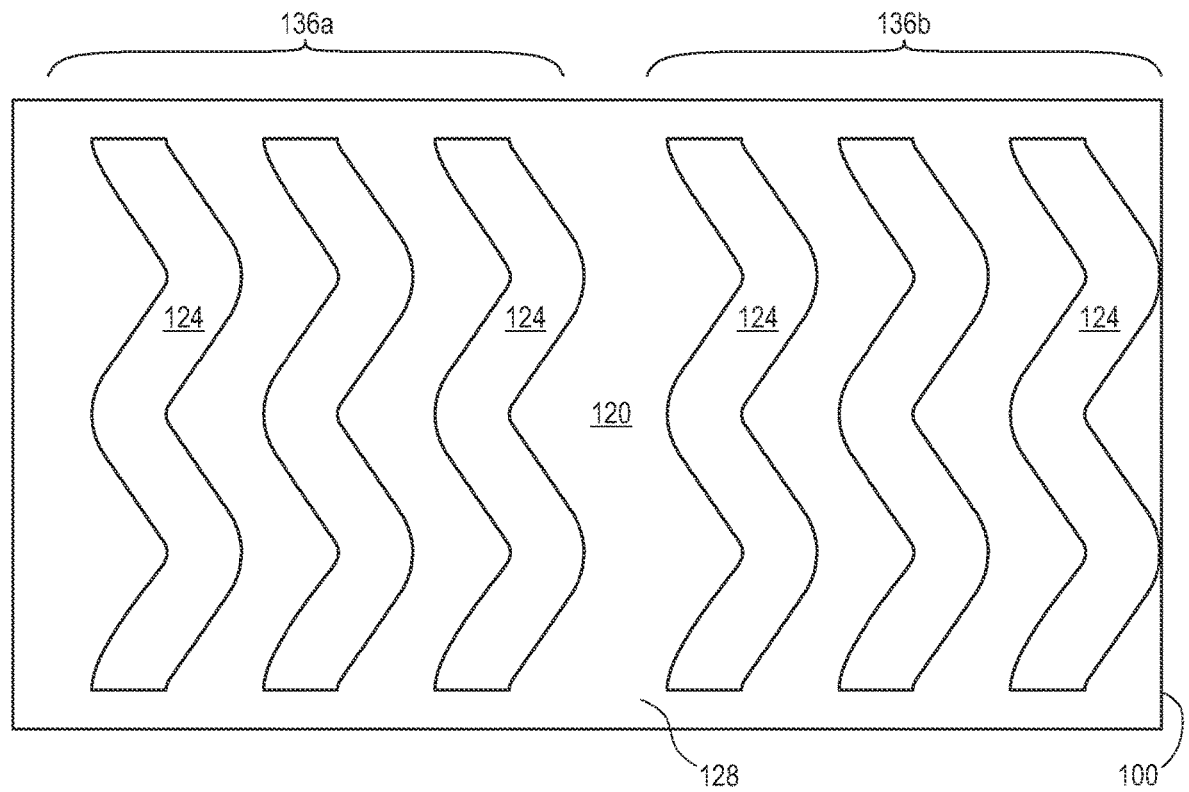
Figure 2H:
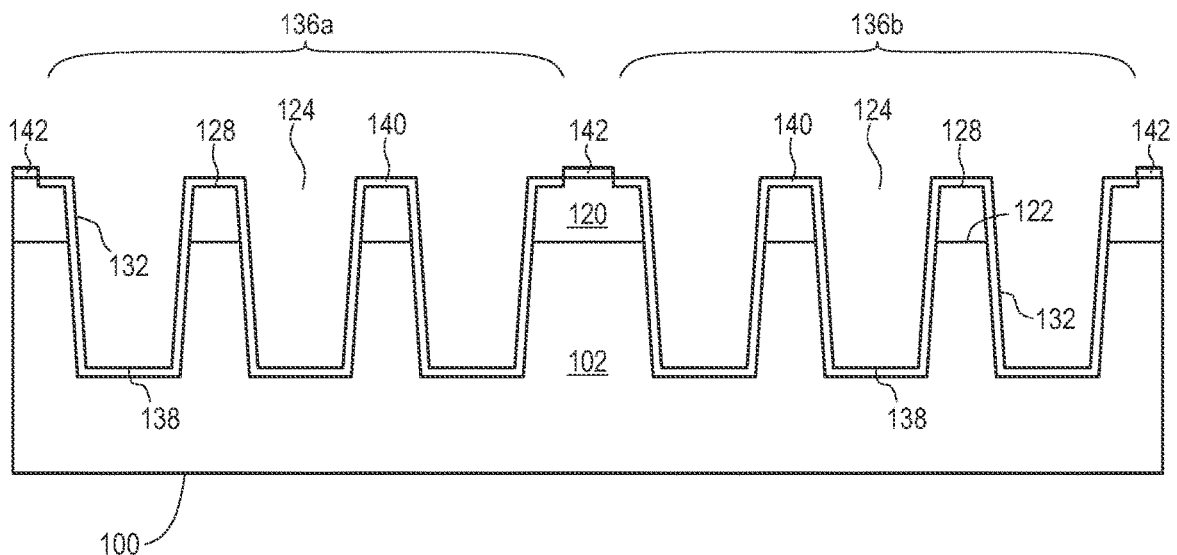
Figure 2I:
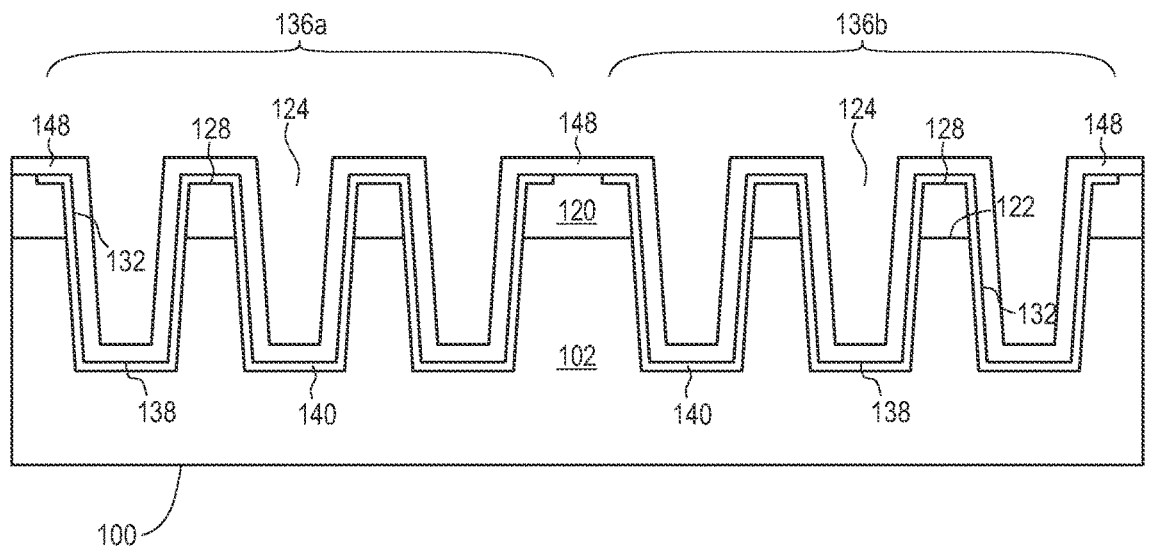
Figure 2J:
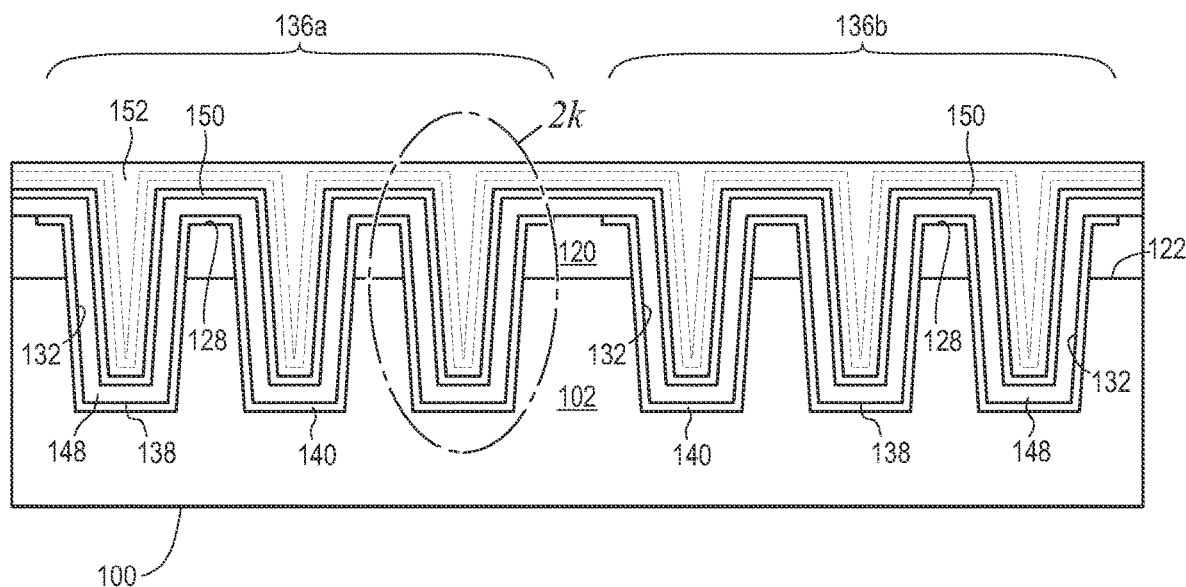
Figure 2K:
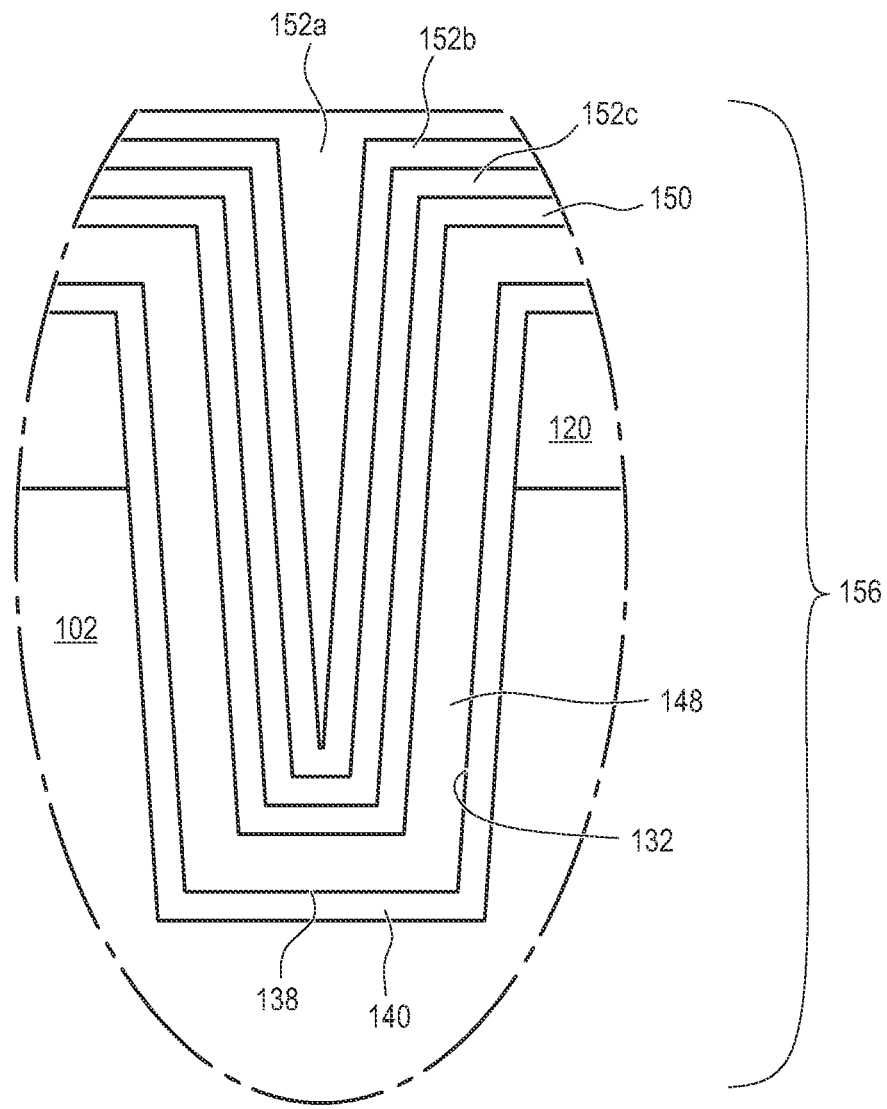
Figure 2L:
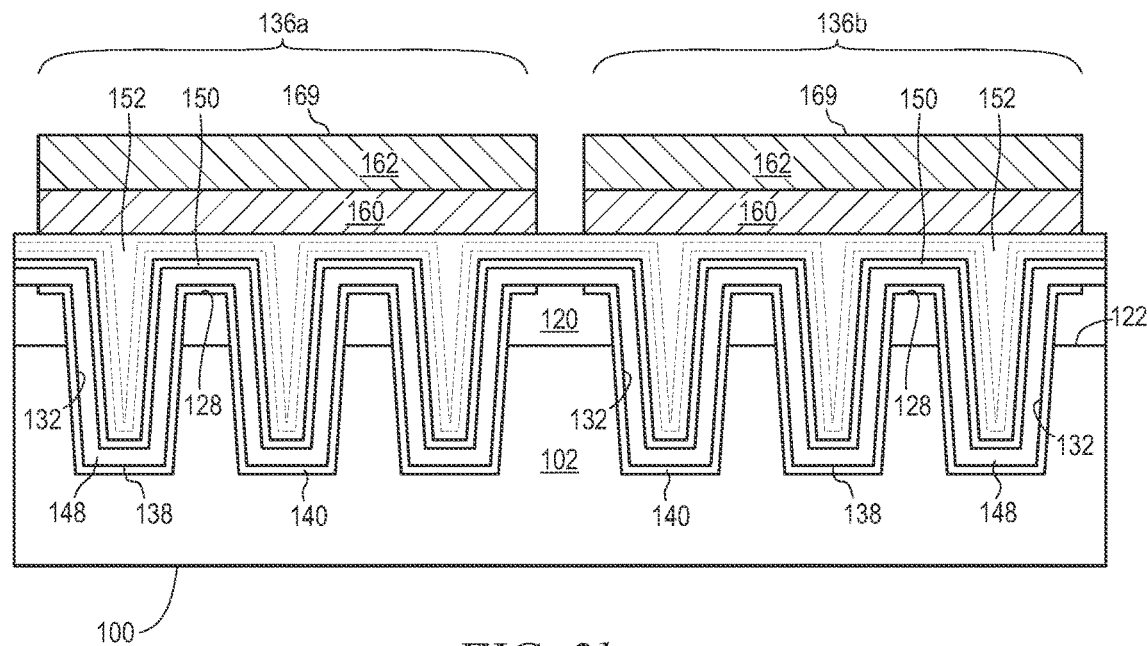
Figure 2M:
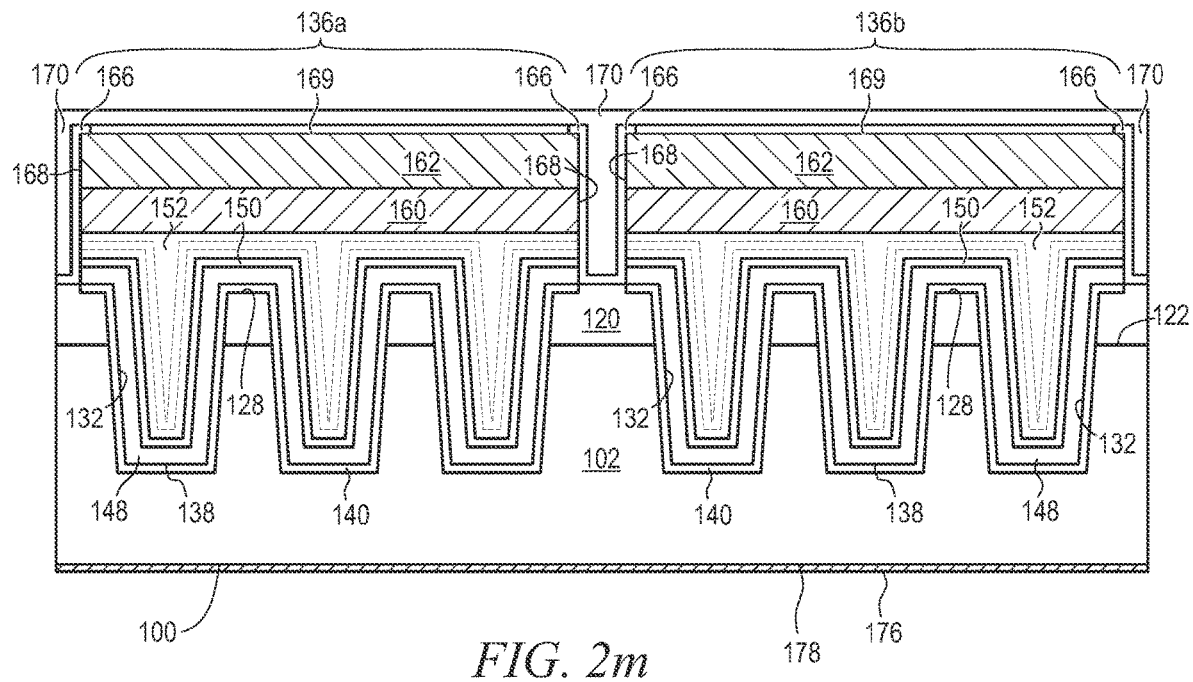
Figure 2N:
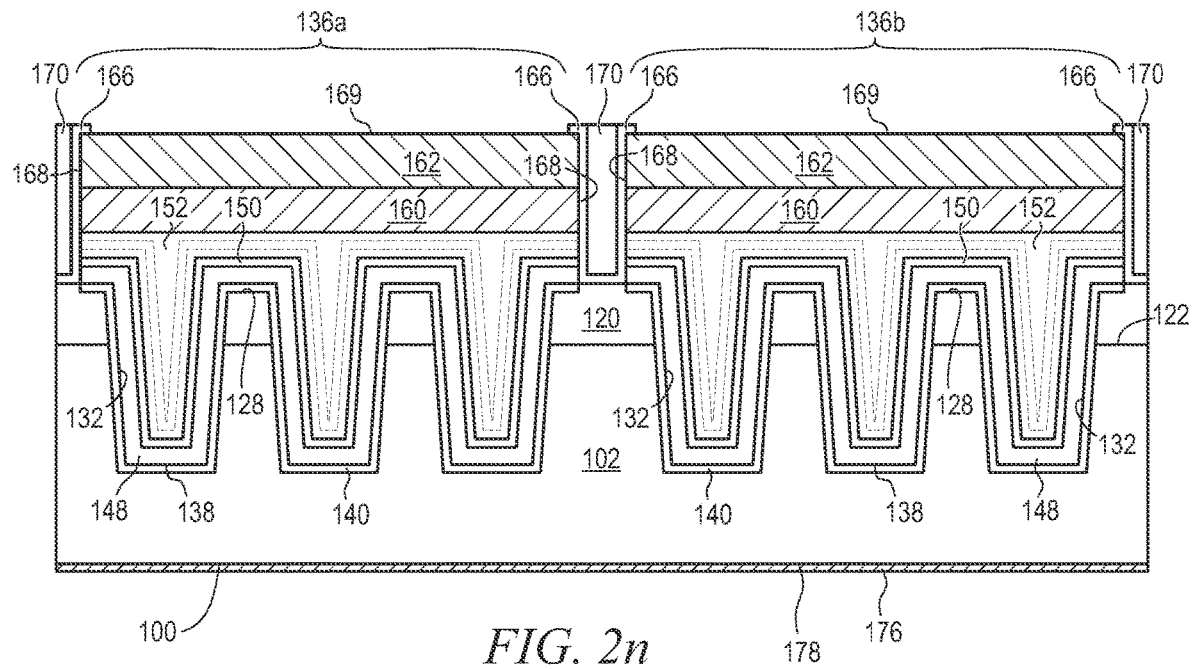
Figure 2O:
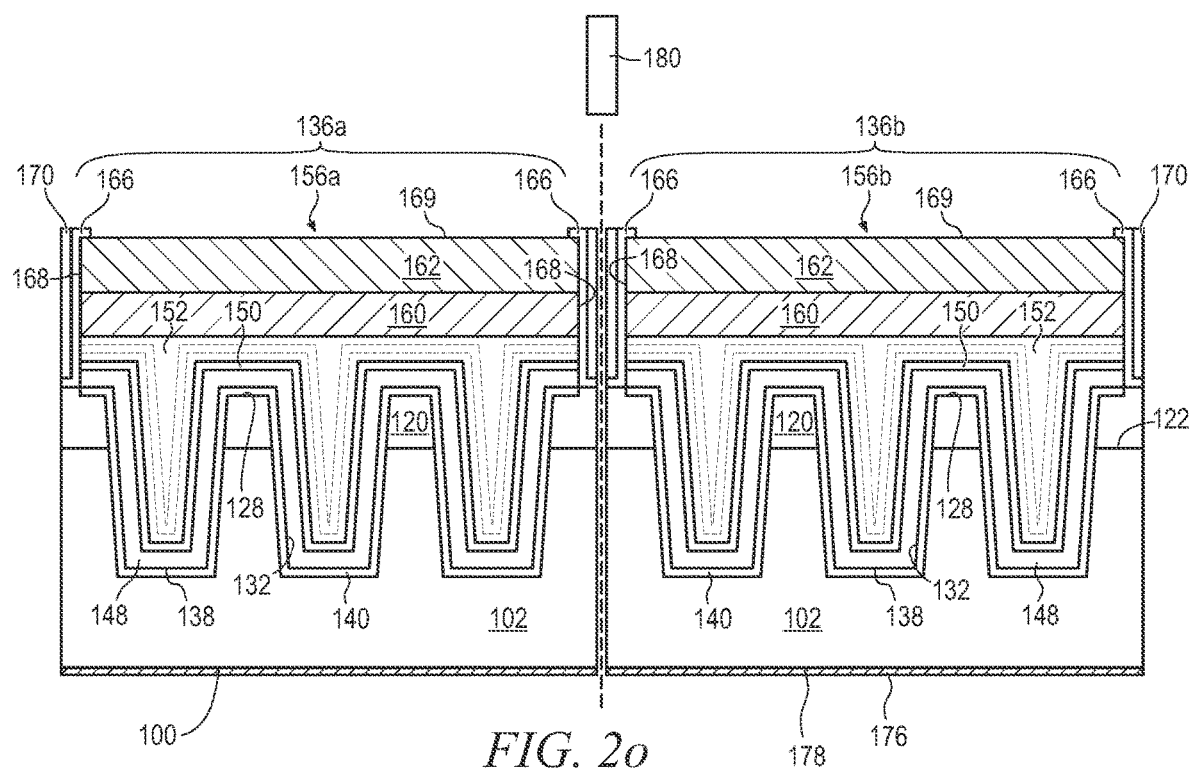

FIGS. 2a-2o illustrate a forming a monolithic surge protection resistor for a high voltage capacitor with a plurality of trenches. FIG. 2a illustrates a portion of substrate 100 from FIG. 1a-1b containing base semiconductor material 102. Substrate 100 has a thickness of about 250 micrometers (mm). In one embodiment, substrate 100 is a Si substrate doped N+ impurities with a concentration of less than 5e18 atoms/cm$^3$. The dopant can be n-type material or p-type material, depending on the type of semiconductor device being made. P-type material denotes a positive carrier type (hole) and n-type material denotes a negative carrier type (electron). Although the present embodiment is described in terms of an N+ substrate, the opposite type semiconductor material can be used to form a P+ substrate.

In various implantation steps described herein, the doping is performed by ion implantation, solid diffusion, liquid diffusion, spin-on deposits, plasma doping, vapor phase doping, laser doping, or the like. Doping with boron (B), aluminum (Al), or gallium (Ga) results in a p-type region, and doping with phosphorus (P), antimony (Sb), or arsenic (As) impurities results in n-type region. Other dopants may be utilized, such as bismuth (Bi) and indium (In), depending on the material of the substrate and the desired strength of the doping.

In FIG. 2b, semiconductor layer 120 is epitaxially grown on surface 122 of substrate 100. The semiconductor layers shown in FIGS. 2a-2o and 4a-4e are not drawn to scale. The epitaxial growth or deposition occurs in a reaction chamber at a temperature of about 980-1230° C. for approximately 20-110 minutes. In one embodiment, semiconductor layer 120 is not intentionally doped with P-type or N-type impurities resulting in a doping concentration of less than 5e13 atoms/cm$^3$ to form a high resistivity silicon epi layer with a thickness of 25-50 mm and resistivity of 3000-5000 ohms/cm$^2$.

In FIG. 2c, trenches or openings 124 are formed from surface 128 through epi layer 120 and extending past surface 122 into base substrate material 102. Trenches 124 can be formed by etching or laser direct ablation (LDA) using laser 130. In one embodiment, trenches 124 are formed by deep reactive ion etching (DRIE) with a width of 3-12 mm and depth of 25-200 mm. The DRIE is a highly anisotropic etch process used to create deep penetration, steep-sided holes, cavities, and trenches in wafers/substrates, typically with high aspect ratios. DRIE utilizes an ionized gas or plasma, such as sulfur hexafluoride ($SF_6$), to remove material from semiconductor layers 102 and 120. DRIE technology permits deeper trenches 124 with straighter sidewalls. To create deep anisotropic etching of silicon, the etch process switches between different plasma chemistries to provide fluorine-based etching of the silicon while protecting the sidewall of the growing feature with a fluorocarbon layer. A $C_4F_8$ plasma deposits a fluoropolymer passivation layer onto the mask and into the etched feature. A bias from the platen causes directional ion bombardment resulting in removal of the fluoropolymer from the base of the feature and the mask. The fluorine free radicals in the $SF_6$ plasma etch the exposed silicon at the base of the etch feature isotropically. The DRIE process repeats multiple times to achieve a vertical etch profile for trenches 124. Alternatively, trenches 124 can be formed by plasma etching, reactive ion etching (RIE), sputter etching, vapor phase etching, and chemical etching. A mask (not shown) is typically formed over surface 128 to isolate trenches 124 during the etching process.

The sidewalls 132 of each trench 124 can be smoothed using an isotropic plasma etch and may be used to remove a thin layer of silicon, e.g., 0.1-1.0 mm from the trench sidewalls. Alternatively, a sacrificial thermal oxide or silicon dioxide layer 134 can be grown on sidewall surfaces 132 of trenches 124, as shown in FIG. 2d. The sacrificial thermal oxide 134 is then removed using an etch, such as a buffered oxide etch, or a diluted hydrofluoric (HF) acid etch, or other wet chemistry followed by HF vapor phase fuming, to smooth the inner wall, as shown in FIG. 2e. Another sacrificial thermal oxide layer 134 is again grown on sidewalls 132 of trenches 124, similar to FIG. 2d. The sacrificial thermal oxide layer 134 is again removed by wet chemistry followed by HF vapor phase fuming to smooth the inner wall, similar to FIG. 2e. The process of repetitive growth of thermal oxide and removal continues multiple times, in accordance with FIGS. 2d-2e, until sidewall 132 of trench 124 is smooth. By eliminating the scalloping from the DRIE etch and using sacrificial thermal oxide layer 134 followed by HF fuming or any oxide and silicon etches, sidewall 132 can be smoothed to a tapered form. The use of the smoothing techniques can produce smooth trench surfaces with rounded corners while removing residual stress and unwanted contaminates.

In FIG. 2e, region 136a represents the area for a first high voltage capacitive structure in substrate 100, possibly contained within a first semiconductor die 104a from FIGS. 1a-1b. Region 136b represents the area for a second high voltage capacitive structure in substrate 100, possibly contained within a second semiconductor die 104b from FIGS. 1a-1b. FIG. 2f shows a top view of trenches 124 formed in surface 128. In this embodiment, trenches 124 are parallel, linear openings in surface 128 extending through epi layer 120 into base substrate material 102. FIG. 2g shows a top view of another embodiment of trenches 124 formed in surface 128. In this embodiment, trenches 124 are interdigitated, serpentine openings in surface 128 extending through epi layer 120 into base substrate material 102. Trenches 124 can have any geometric shape, such as rectangular, circular, oval, which serves to increase the surface area of the dielectric layers providing the capacitive function. A limited number of trenches 124 is shown in FIGS. 2f and 2g for purposes of illustration. In practice, 1 to 450 or more trenches 124 can be formed in region 136a or 136b and will constitute one discrete high voltage capacitor. Returning to FIG. 2e, trenches 124 can be tapered with a width W1 of 3.5-12.5 mm proximate to surface 128 and a width W2 of 3.0-12.0 mm proximate to bottom surface 138 of the trench. The depth of trench 124 is 25-200 mm and, in one embodiment, 150 mm.

In FIG. 2h, sidewalls 132 of trenches 124 are diffused or implanted with N+ dopant to form N+ semiconductor layer 140. Given the depth of trenches 124, diffusion may be a more practical deposition method. An insulating layer 142 can be formed over surface 128 to mask and pattern the diffusion. The diffusion is conducted with phosphorus impurities at a temperature of 950-1100° C. for 20-120 minutes to form N+ semiconductor layer 140 having an impurity distribution of 2-3e19 atoms/cm$^3$. Following diffusion, a drive-in step can be performed at a temperature of 950-1100° C. for 20-120 minutes.

In FIG. 2i, an insulating layer 148 is conformally formed over surface 128 and into trenches 124 within regions 136a and 136b. Insulating layer 148 contains one or more layers of $SiO_2$, $Si_3N_4$, SiON, $Ta_2O_5$, $Al_2O_3$, polyimide, BCB, PBO, or other suitable dielectric material. Insulating layer 148 is formed using PVD, CVD, PECVD, or LPCVD). In one embodiment, insulating layer 148 is a local oxidation of silicon (LOCOS) oxide layer with a thickness of 0.5-7.5 mm to form a high field strength dielectric layer operating as a capacitor. Insulating layer 148 is conformally formed over surface 128 and sidewalls 132 and bottom surface 138 of trench 124 to increases the surface area of the capacitor.

In FIG. 2j, an insulating layer 150 is conformally formed over insulating layer 148. Insulating layer 150 contains one or more layers of $SiO_2$, $Si_3N_4$, SiON, $Ta_2O_5$, $Al_2O_3$, polyimide, BCB, PBO, or other suitable dielectric material. Insulating layer 150 is formed using PVD, CVD, PECVD, or LPCVD. In one embodiment, insulating layer 150 is a first $Si_3N_4$ layer with a thickness of 0.5-0.30 mm, and a second low temperature oxide (TLO) layer, such as $SiO_2$, with a thickness of 0.1-1.0 mm, to form a protective layer against moisture and other contaminants over insulating layer 148.

A polysilicon layer 152 is formed over insulating layer 150 using CVD. Polysilicon layer 152 is formed as one or more thin film layers to completely fill trenches 124. In one embodiment, a first layer of polysilicon 152a is formed over insulating layer 150 and into trenches 124 with a thickness of 0.5-2.5 mm. Polysilicon 152a is doped with phosphorus oxychloride (POCl3) impurities using diffusion deposition at 950-1100° C. A second layer of polysilicon 152b is formed over polysilicon layer 152a and into trenches 124 with a thickness of 0.5-2.5 mm. Polysilicon 152b is doped with POCl3 impurities using diffusion deposition at 950-1100° C. A third layer of polysilicon 152c is formed over polysilicon layer 152b and into trenches 124 with a thickness of 0.5-2.5 mm. Polysilicon 152c is doped with POCl3 impurities using diffusion deposition at 950-1100° C. Following diffusion, a drive-in step can be performed at a temperature of 950-1100° C. for 0.5-2.0 hours.

FIG. 2k shows further detail of one trench 124 with layers 140-152. The combination of insulating layer 140-152 constitute one high voltage capacitor 156, primarily from dielectric properties of insulating layers 148-150. For example, high voltage capacitor 156 is rated from 200v-3000v.

In FIG. 2l, an electrically conductive layer 160 is formed over polysilicon layer 152 within region 136a and over polysilicon layer 152 within region 136b. An electrically conductive layer 162 is formed over conductive layer 160 within region 136a and over conductive layer 160 within region 136b. Conductive layers 160-162 can be one or more layers of Al, Cu, Sn, Ni, Au, Ag, or other suitable electrically conductive material formed using patterning with PVD, CVD, PECVD, sputtering, electrolytic plating, electroless plating process, or other suitable metal deposition process. In one embodiment, conductive layer 160 is palladium. Conductive layer 160 can be heat cycled between 250-450° C. to form palladium silicide for good ohmic contact to polysilicon layer 152. In other embodiments, platinum can be used to form a platinum silicide for good ohmic contact to the polysilicon layer. Cobalt can also be used to form a low resistance ohmic contact. Conductive layer 162 is titanium-platinum-gold or titanium-platinum-aluminum with titanium providing an adhesion layer, platinum as a barrier layer, and gold or aluminum as external contact.

In FIG. 2m, conductive layers 160-162 are used as a mask to remove a portion of polysilicon layer 152 and insulating layers 148 and 150 down to surface 128, e.g., by using a dry etch, followed by a wet dip for higher selectivity. An insulating layer 166 is formed over surface 128 and sidewalls 168 of conductive layers 160-162 and top surface 169. Insulating layer 166 contains one or more layers of SiO2, Si3N4, SiON, Ta2O5, Al2O3, polyimide, BCB, PBO, or other suitable dielectric material. Insulating layer 166 is formed using PVD, CVD, PECVD, or LPCVD. In one embodiment, insulating layer 166 is Si3N4 layer with a thickness of 1.0 mm. An insulating layer 170 is formed over insulating layer 166. Insulating layer 170 contains one or more layers of SiO2, Si3N4, SiON, Ta2O5, Al2O3, polyimide, BCB, PBO, or other suitable dielectric material. Insulating layer 170 is formed using PVD, CVD, PECVD, or LPCVD. In one embodiment, insulating layer 170 is a high field strength polymer, such as BCB or polyimide, with a thickness of 8.0-20.0 mm to cover the edges of conductive layer 162. Insulating layer 170 is cured between 250-400° C. for 1-4 hours.

An electrically conductive layer 176 is formed over surface 178 of substrate 100. Conductive layer 176 can be one or more layers of Al, Cu, Sn, Ni, Au, Ag, or other suitable electrically conductive material formed using patterning with PVD, CVD, PECVD, sputtering, electrolytic plating, electroless plating process, or other suitable metal deposition process.

In FIG. 2n, a portion of insulating layer 166 and insulating layer 170 is removed to expose surface 169 of conductive layer 162. In FIG. 2o, substrate 100 is singulated using saw blade or cutting tool 180 to separate high voltage capacitor 156a in region 136a from high voltage capacitor 156b in region 136b. Conductive layers 162 and 176 provide the opposing metal terminals with insulating layers 148-150 as the intermediate dielectric of the high voltage capacitors 156a-156b.

Figure 3:
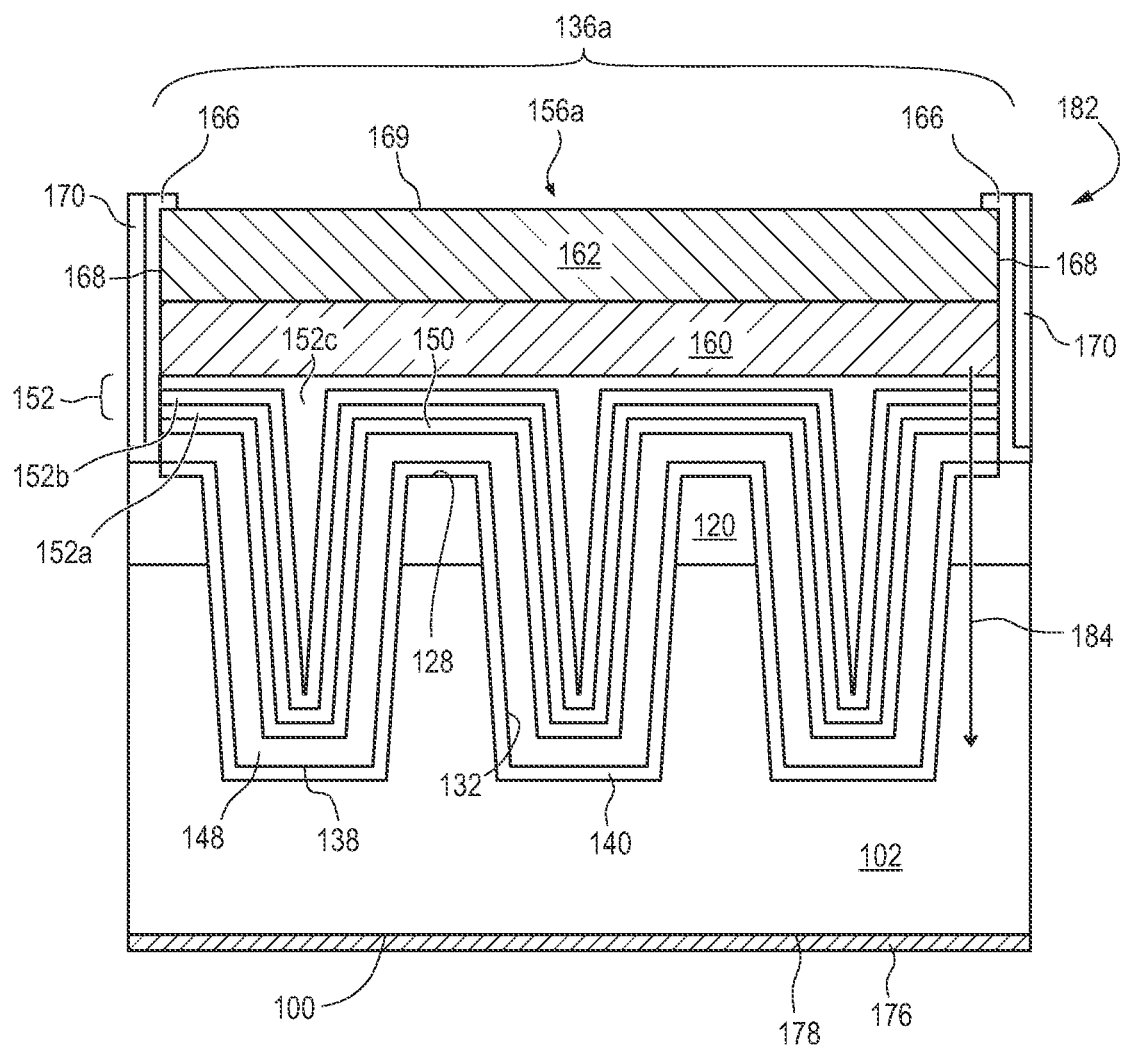
FIG. 3 illustrates the high voltage capacitor with a plurality of trenches from FIGS. 2a-2o.

FIG. 3 illustrates semiconductor package 182 containing high voltage capacitor 156. Conductive layers 162 and 176 and insulating layers 148 and 150 provide the primary capacitive function. The high resistivity semiconductor layer 120 protects capacitor 156 from surge of high voltage, causing a spike in excessive leakage currents. In the event of a high voltage incident, excessive leakage current is routed through semiconductor layer 120 along vertical path 184, away from the edges of insulating layers 148-15. Semiconductor layer 120 provides the ability to control the direction and magnitude of the leakage current during a high voltage occurrence. Semiconductor layer 120 operates as a surge protection resistor for a high voltage capacitor 156. Semiconductor layer 120 can also operate as a surge protection resistor for other semiconductor devices, such as a diode, transistor, or other circuit or circuit element. Semiconductor layer 120 is monolithically integrated into semiconductor package 182 and high voltage capacitor 156 to simplify the design process and reduce manufacturing cost.

Figure 4A:
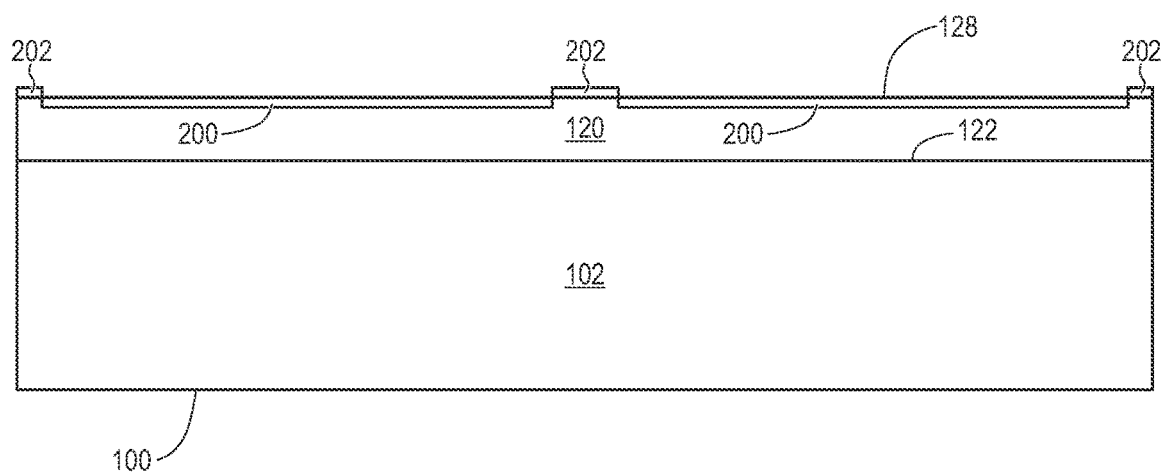
FIGS. 4a-4e illustrate another process of forming a monolithic surge protection resistor for a high voltage capacitor with a lateral dielectric.

In another embodiment, continuing from FIG. 2b, surface 128 of substrate 100 is diffused or implanted with N+ dopant to form N+ semiconductor layer 200, as shown in FIG. 4a. An insulating layer 202 can be formed over surface 128 to mask and pattern the diffusion. The diffusion is conducted with phosphorus impurities at a temperature of 950-1100° C. for 0.25-1.5 hours to form N+ semiconductor layer 200 having an impurity distribution of 2-3eE19 atoms/cm$^3$. Following diffusion, a drive-in step can be performed at a temperature of 950-1100° C. for 0.5-2.5 hours.

Figure 4B:
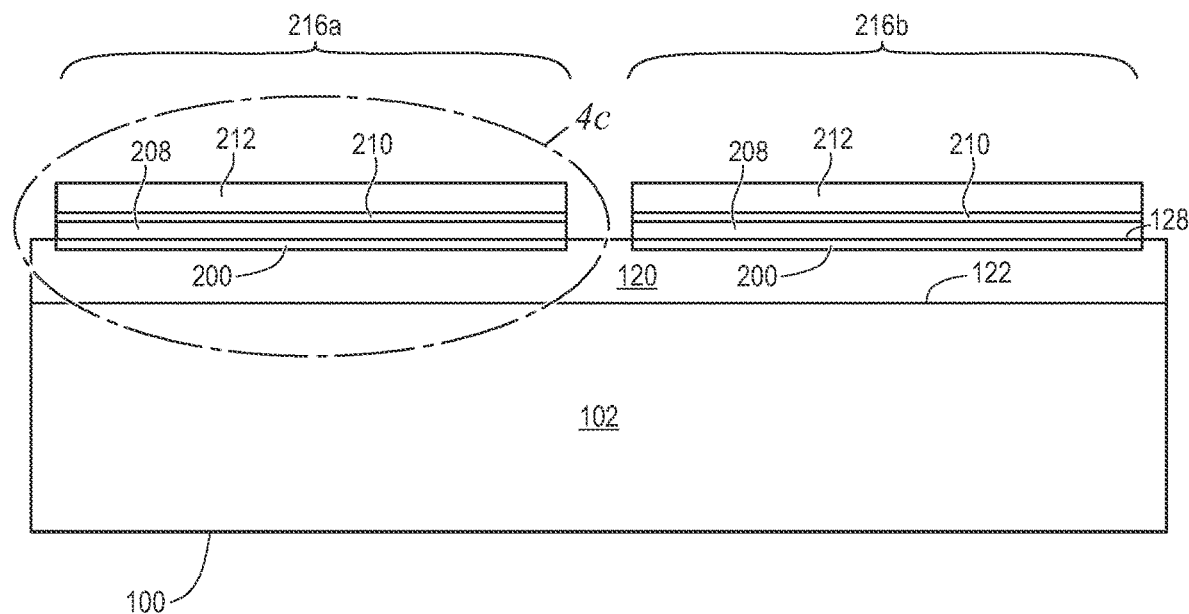

In FIG. 4b, an insulating layer 208 is formed over surface 128. Insulating layer 208 contains one or more layers of SiO2, Si3N4, SiON, Ta2O5, Al2O3, polyimide, BCB, PBO, or other suitable dielectric material. Insulating layer 208 is formed using PVD, CVD, PECVD, or LPCVD. In one embodiment, insulating layer 208 is a LOCOS oxide layer with a thickness of 0.5-7.5 mm to form a high field strength dielectric layer operating as a capacitor.

An insulating layer 210 is formed over insulating layer 208. Insulating layer 210 contains one or more layers of SiO2, Si3N4, SiON, Ta2O5, Al2O3, polyimide, BCB, PBO, or other suitable dielectric material. Insulating layer 210 is formed using PVD, CVD, PECVD, or LPCVD. In one embodiment, insulating layer 210 is a first Si3N4 layer with a thickness of 0.5 mm, and a second TLO layer, such as SiO2, with a thickness of 1.0 mm, to form a protective layer against moisture and other contaminants over insulating layer 208.

A polysilicon layer 212 is formed over insulating layer 210 using CVD. Polysilicon layer 212 is formed as one or more thin film layers. In one embodiment, a first layer of polysilicon 212a is formed over insulating layer 210 with a thickness of 0.5-2.5 mm. Polysilicon 212a is doped with POCl3 impurities using diffusion deposition at 950-1100° C. A second layer of polysilicon 212b is formed over polysilicon layer 212a with a thickness of 0.5-2.5 mm. Polysilicon 212b is doped with POCl3 impurities using diffusion deposition at 950-1100° C. A third layer of polysilicon 212c is formed over polysilicon layer 212b with a thickness of 0.5-2.5 mm. Polysilicon 212c is doped with POCl3 impurities using diffusion deposition at 950-1100° C. Following diffusion, a drive-in step can be performed at a temperature of 950-1100° C. for 0.5-2.5 hours.

Region 216a represents the area for a first high voltage capacitive structure in substrate 100, possibly contained within a first semiconductor die 104a from FIGS. 1a-1b. Region 216b represents the area for a second high voltage capacitive structure in substrate 100, possibly contained within a second semiconductor die 104b from FIGS. 1a-1b.

Figure 4C:
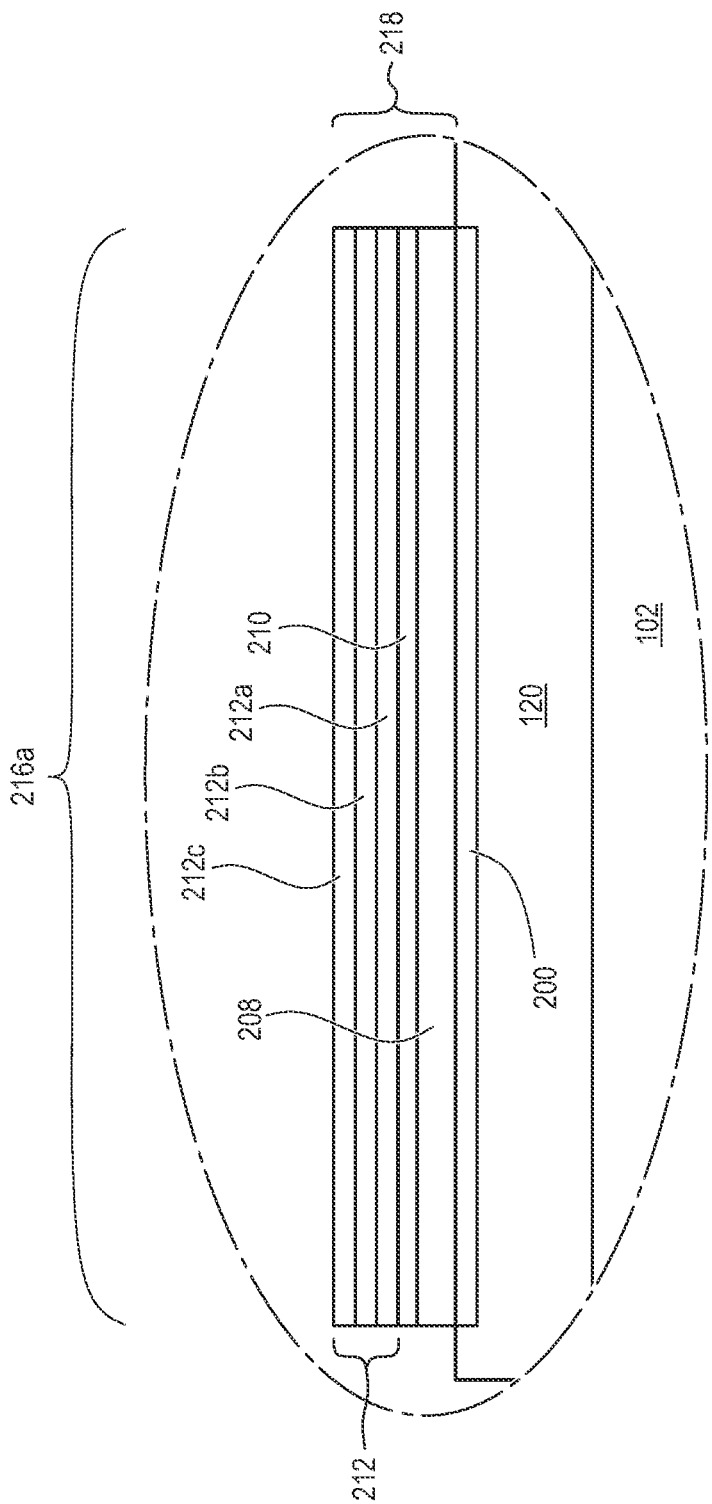

FIG. 4c shows further detail of a portion of region 216 with layers 200-212. The combination of insulating layer 200-212 constitutes one high voltage capacitor 218, primarily from dielectric properties of insulating layers 208-210. For example, high voltage capacitor 218 is rated from 200v-3000v.

Figure 4D:
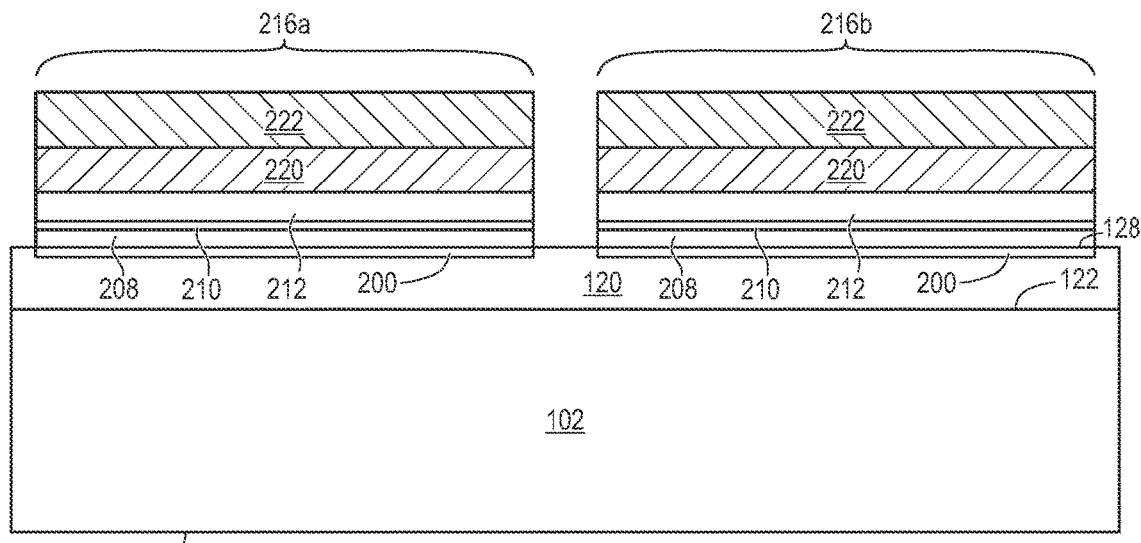
Figure 4E:
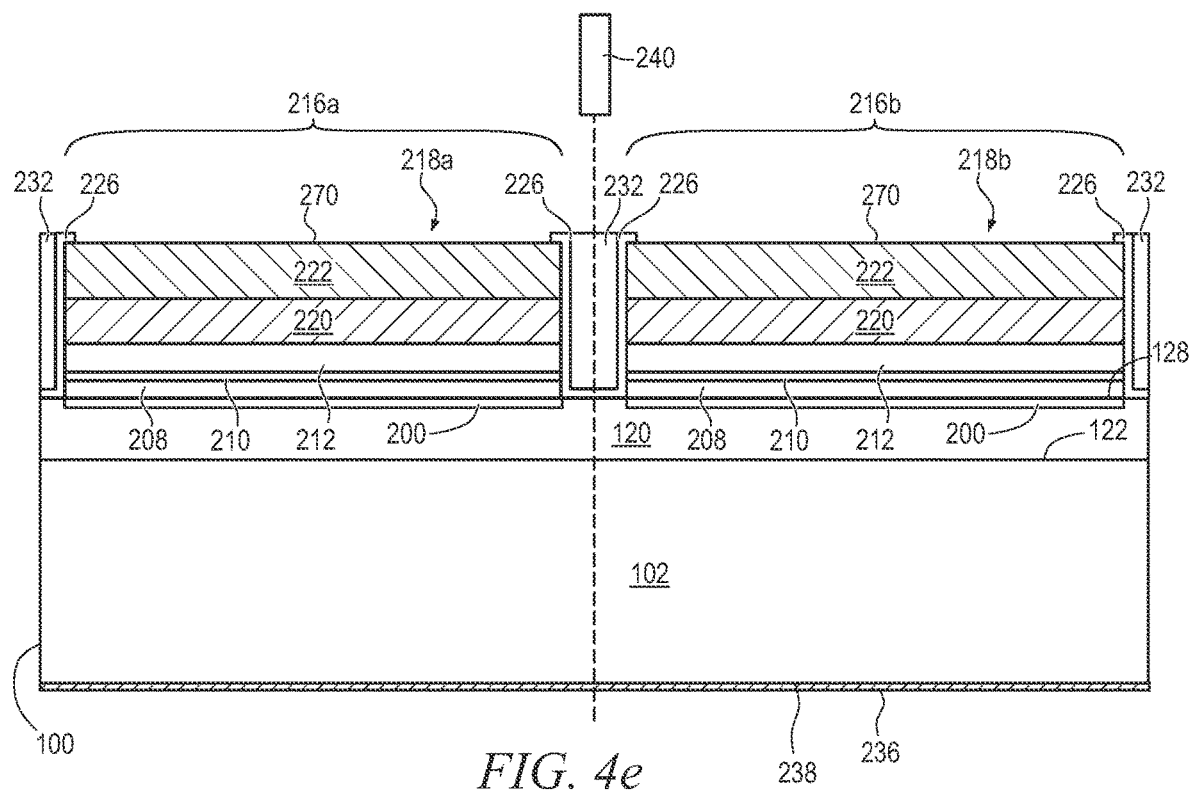

In FIG. 4d, an electrically conductive layer 220 is formed over polysilicon layer 212 in region 216a and over polysilicon layer 212 is region 216b. An electrically conductive layer 222 is formed over conductive layer 220 in region 216a and over conductive layer 220 is region 216b. Conductive layers 220-222 can be one or more layers of Al, Cu, Sn, Ni, Au, Ag, or other suitable electrically conductive material formed using patterning with PVD, CVD, PECVD, sputtering, electrolytic plating, electroless plating process, or other suitable metal deposition process. In one embodiment, conductive layer 220 is palladium. Conductive layer 220 can be heat cycled between 250-450° C. to form palladium silicide for good ohmic contact to polysilicon layer 212. In other embodiments, platinum can be used to form a platinum silicide for good ohmic contact to the polysilicon layer. Cobalt can also be used to form a low resistance ohmic contact. Conductive layer 222 is titanium-platinum-gold or titanium-platinum-aluminum with titanium providing an adhesion layer, platinum as a barrier layer, and gold or aluminum as external contact.

Conductive layers 220-222 can be used as a mask to remove a portion of polysilicon layer 152 and insulating layers 148 and 150, e.g., by using a dry etch, followed by a wet dip for higher selectivity. An insulating layer 226 is formed over surface 128 and sidewalls 228 of conductive layers 220-222 and top surface 270, similar to FIG. 2m. Insulating layer 226 contains one or more layers of SiO2, Si3N4, SiON, Ta2O5, Al2O3, polyimide, BCB, PBO, or other suitable dielectric material. Insulating layer 226 is formed using PVD, CVD, PECVD, or LPCVD. In one embodiment, insulating layer 226 is Si3N4 layer with a thickness of 0.5-1.5 mm. An insulating layer 232 is formed over insulating layer 226, similar to FIG. 2m. Insulating layer 232 contains one or more layers of SiO2, Si3N4, SiON, Ta2O5, Al2O3, polyimide, BCB, PBO, or other suitable dielectric material. Insulating layer 232 is formed using PVD, CVD, PECVD, or LPCVD. In one embodiment, insulating layer 232 is a high field strength polymer, such as BCB or polyimide, with a thickness of 8.0-20.0 mm to cover the edges of conductive layer 222. Insulating layer 232 is cured at 250-400° C. for 1-4 hours.

An electrically conductive layer 236 is formed over surface 238 of substrate 100. Conductive layer 236 can be one or more layers of Al, Cu, Sn, Ni, Au, Ag, or other suitable electrically conductive material formed using patterning with PVD, CVD, PECVD, sputtering, electrolytic plating, electroless plating process, or other suitable metal deposition process.

A portion of insulating layer 226 and insulating layer 232 is removed to expose surface 270 of conductive layer 222. Substrate 100 is singulated using saw blade or cutting tool 240 to separate high voltage capacitor 218a in region 216a from high voltage capacitor 218b in region 216b, similar to FIG. 2o. Conductive layers 222 and 236 provide the opposing metal terminals with insulating layers 208-210 as the intermediate dielectric of the high voltage capacitors 218a-218b.

Figure 5:
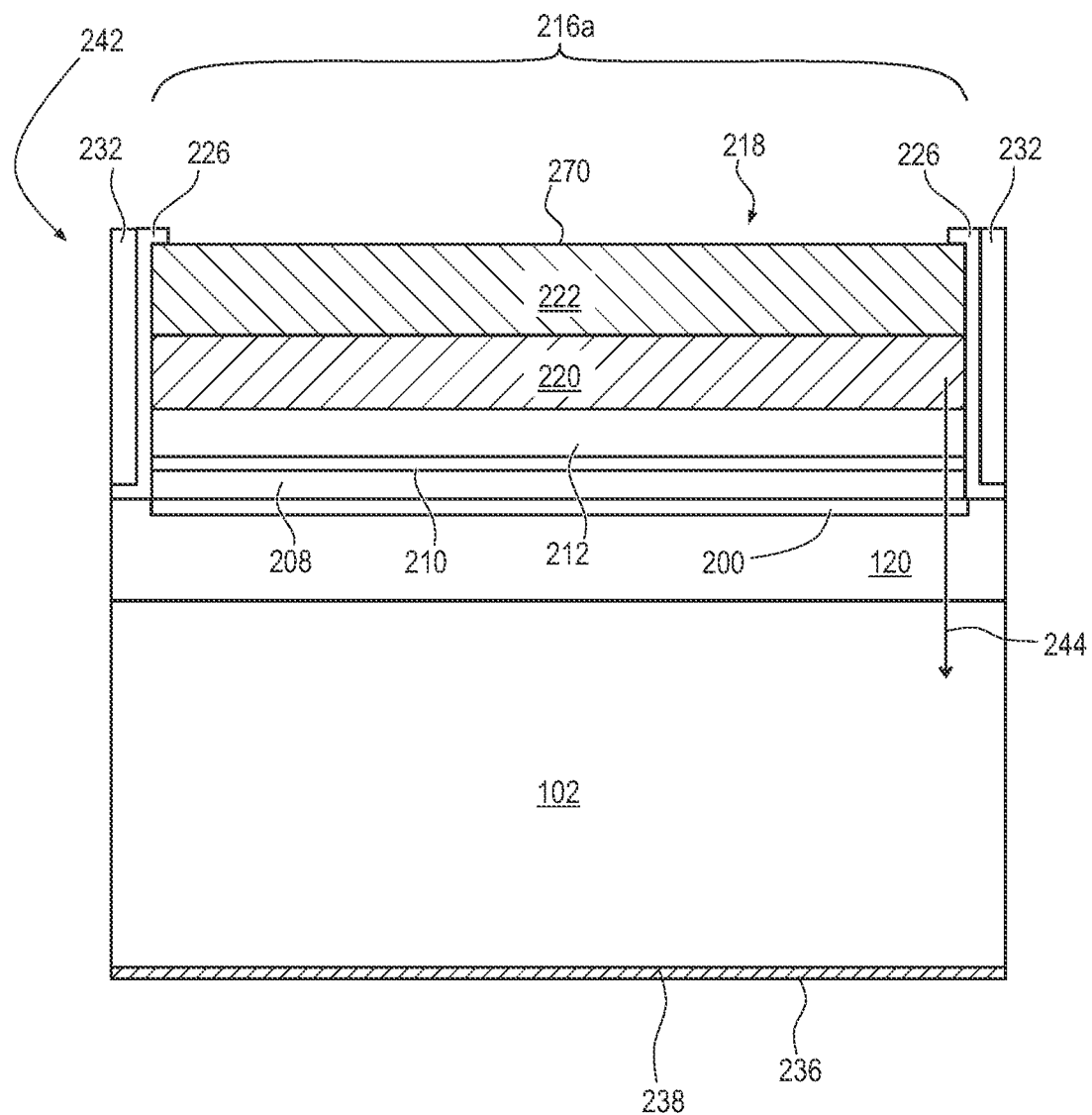
FIG. 5 illustrates the high voltage capacitor with a lateral dielectric from FIGS. 4a-4e.

FIG. 5 illustrates semiconductor package 242 containing high voltage capacitor 218. Conductive layers 222 and 236 and insulating layers 208 and 210 provide the primary capacitive function. The high resistivity semiconductor layer 120 protects capacitor 218 from surge of high voltage, causing a spike in excessive leakage currents. In the event of a high voltage incident, excessive leakage current is routed through semiconductor layer 120 along vertical path 244, away from the edges of insulating layers 208-210. Semiconductor layer 120 provides the ability to control the direction and magnitude of the leakage current during a high voltage occurrence. Semiconductor layer 120 operates as a surge protection resistor for a high voltage capacitor 218. Semiconductor layer 120 can also operate as a surge protection resistor for other semiconductor devices, such as a diode, transistor, or other circuit or circuit element. Semiconductor layer 120 is monolithically integrated into semiconductor package 242 and high voltage capacitor 218 to simplify the design process and reduce manufacturing cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a first semiconductor layer comprising a high resistivity formed over a first surface of the substrate; and
   a circuit element formed at least partially over the first semiconductor layer, wherein the circuit element includes,
   (a) a trench extending through the first semiconductor layer and into the substrate,
   (b) a first insulating layer formed in contact with a sidewall of the first semiconductor layer in the trench,
   (c) a polysilicon layer formed over the first insulating layer, and
   (d) a first conductive layer formed over a second surface of the substrate opposite the first surface of the substrate.

2. The semiconductor device of claim 1, wherein the high resistivity of the first semiconductor layer is in the range of 3000-5000 ohms/cm$^2$.

3. The semiconductor device of claim 1, wherein the circuit element includes a capacitive structure comprising the polysilicon layer, first insulating layer, and first conductive layer.

4. The semiconductor device of claim 3, wherein the capacitive structure further includes a second conductive layer formed over the semiconductor layer.

5. The semiconductor device of claim 3, wherein the capacitive structure includes:

the trench extending through the first semiconductor layer and into the substrate; and the first insulating layer formed in contact with the sidewall of the trench.

6. The semiconductor device of claim 5, wherein the capacitive structure further includes:

a second insulating layer formed over the first insulating layer; and the polysilicon layer formed over the second insulating layer.

7. A semiconductor device, comprising:

a semiconductor material;

an epitaxial layer comprising a resistivity formed over a first surface of the semiconductor material; and a circuit element formed at least partially over the epitaxial layer, wherein the circuit element includes,
(a) a trench extending through the epitaxial layer and into the semiconductor material,
(b) a first insulating layer formed over a sidewall of the epitaxial layer in the trench,
(c) a first conductive layer formed over the first insulating layer, and
(d) a second conductive layer formed over a second surface of the semiconductor material opposite the first surface of the semiconductor material.

8. The semiconductor device of claim 7, wherein the resistivity of the epitaxial layer is in the range of 3000-5000 ohms/cm$^2$.

9. The semiconductor device of claim 7, wherein the circuit element includes a capacitor comprising the first conductive layer, first insulating layer, and second conductive layer.

10. The semiconductor device of claim 9, wherein the capacitor extends through the epitaxial layer and into the semiconductor material.

11. The semiconductor device of claim 9, wherein the capacitor further includes a third conductive layer formed over the epitaxial layer.

12. The semiconductor device of claim 7, wherein the capacitor further includes:

a second insulating layer formed over the first insulating layer; and the first conductive layer formed over the second insulating layer.

13. The semiconductor device of claim 7, further including a semiconductor layer formed at least partially in the epitaxial layer.

14. A method of making a semiconductor device, comprising:

providing a substrate;

forming a first semiconductor layer comprising a high resistivity over a first surface of the substrate; and forming a circuit element at least partially over the first semiconductor layer, wherein forming the circuit element includes,
(a) forming a trench extending through the first semiconductor layer and into the substrate,
(b) forming a first insulating layer over a sidewall of the first semiconductor layer in the trench,
(c) forming a first conductive layer over the first insulating layer, and
(d) forming a second conductive layer over a second surface of the substrate opposite the first surface of the substrate.

15. The method of claim 14, wherein the high resistivity of the first semiconductor layer is in the range of 3000-5000 ohms/cm$^2$.

16. The semiconductor device of claim 14, wherein the circuit element includes a capacitor comprising the first conductive layer, first insulating layer, and second conductive layer.

17. The method of claim 16, wherein the capacitor extends through the first semiconductor layer and into the substrate.

18. The method of claim 16, wherein forming the capacitor further includes forming a third conductive layer over the first semiconductor layer.

19. The method of claim 14, wherein forming the capacitor further includes:

forming a second insulating layer over the first insulating layer; and forming the first conductive layer over the second insulating layer.

20. The method of claim 14, further including forming a second semiconductor layer at least partially in the first semiconductor layer.

* * * * *